(12) United States Patent
Pisek et al.

(10) Patent No.: US 8,811,452 B2
(45) Date of Patent: Aug. 19, 2014

(54) METHOD AND APPARATUS FOR PARALLEL PROCESSING TURBO DECODER

(75) Inventors: Eran Pisek, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 315 days.

(21) Appl. No.: 12/814,157

(22) Filed: Jun. 11, 2010

(65) Prior Publication Data

US 2011/0134969 A1 Jun. 9, 2011

Related U.S. Application Data

(60) Provisional application No. 61/283,703, filed on Dec. 8, 2009.

(51) Int. Cl.
*H04B 1/00* (2006.01)

(52) U.S. Cl.
USPC .......................................................... 375/147

(58) Field of Classification Search
USPC ............ 375/147, 340, E1.011; 714/752, 755, 714/E11.032
See application file for complete search history.

(56) References Cited

U.S. PATENT DOCUMENTS

| | | | | |
|---|---|---|---|---|
| 6,166,667 A * | 12/2000 | Park | ................................. | 341/94 |
| 6,392,572 B1 * | 5/2002 | Shiu et al. | ........................ | 341/81 |
| 6,760,879 B2 * | 7/2004 | Giese et al. | ..................... | 714/755 |
| 7,360,040 B2 * | 4/2008 | Suzuki et al. | .................. | 711/157 |
| 7,409,606 B2 * | 8/2008 | Nakai | ............................ | 714/701 |
| 7,652,597 B2 * | 1/2010 | Kutz et al. | ........................ | 341/82 |
| 7,831,894 B2 * | 11/2010 | Lee et al. | ....................... | 714/794 |
| 7,882,416 B2 * | 2/2011 | Shen et al. | ..................... | 714/755 |
| 7,979,772 B2 * | 7/2011 | Oz et al. | ......................... | 714/752 |
| 7,984,368 B2 * | 7/2011 | Pisek et al. | ..................... | 714/794 |
| 8,035,537 B2 * | 10/2011 | Andreev et al. | .................. | 341/81 |
| 8,065,588 B2 * | 11/2011 | Shen et al. | ..................... | 714/763 |
| 2003/0097633 A1 * | 5/2003 | Nguyen | .......................... | 714/786 |
| 2006/0036819 A1 * | 2/2006 | Suzuki et al. | .................. | 711/157 |
| 2006/0083174 A1 * | 4/2006 | Shim et al. | ...................... | 370/245 |
| 2006/0184599 A1 * | 8/2006 | Wang et al. | .................... | 708/422 |
| 2006/0184774 A1 * | 8/2006 | Pisek et al. | ..................... | 712/226 |
| 2006/0184855 A1 * | 8/2006 | Wang et al. | .................... | 714/755 |
| 2006/0211387 A1 * | 9/2006 | Pisek et al. | ...................... | 455/130 |
| 2006/0265635 A1 * | 11/2006 | Tokita et al. | .................. | 714/794 |
| 2006/0277236 A1 * | 12/2006 | Pisek et al. | ..................... | 708/231 |
| 2007/0061666 A1 * | 3/2007 | Nakai | ........................... | 714/755 |
| 2008/0022191 A1 * | 1/2008 | Stolpman et al. | ............. | 714/776 |

(Continued)

OTHER PUBLICATIONS

Ajit Nimbalker, Yufei Blankenship, Brian Classon, T. Keith Blankenship, "ARP and QPP Interleavers for LTE Turbo Coding", 2008, IEEE Communications Society.*

(Continued)

*Primary Examiner* — Chieh M Fan
*Assistant Examiner* — Bahman Badipour

(57) ABSTRACT

A receiver capable of decoding encoded transmissions. The receiver includes a number of receive antennas configured to receive data; a plurality of memory units that store the received data; and a plurality of decoders configured to perform a Turbo decoding operation. Each of the plurality of decoders decodes at least a portion of the received data using at least a portion of a decoding matrix. The receiver also includes a data switch coupled between the plurality of decoders and the plurality of memory units. The data switch configured to vary a decode operation from an long term evolution (LTE) based operation to a Wideband Code Division Multiple Access (WCDMA) operation.

20 Claims, 9 Drawing Sheets

(56) References Cited

U.S. PATENT DOCUMENTS

| | | | |
|---|---|---|---|
| 2008/0059772 A1* | 3/2008 | Pisek et al. | 712/220 |
| 2008/0075046 A1* | 3/2008 | Dominique et al. | 370/335 |
| 2008/0115033 A1* | 5/2008 | Lee et al. | 714/755 |
| 2008/0123781 A1* | 5/2008 | Pisek et al. | 375/340 |
| 2009/0094505 A1* | 4/2009 | Nguyen | 714/780 |
| 2009/0138668 A1* | 5/2009 | Blankenship | 711/157 |
| 2009/0238066 A1 | 9/2009 | Cheng | |
| 2010/0005221 A1* | 1/2010 | Nieminen | 711/5 |
| 2010/0077265 A1* | 3/2010 | Wei et al. | 714/701 |
| 2010/0146362 A1* | 6/2010 | Pisek et al. | 714/752 |
| 2010/0287343 A1* | 11/2010 | Neeman et al. | 711/157 |
| 2011/0055663 A1* | 3/2011 | Lee et al. | 714/763 |
| 2011/0066913 A1* | 3/2011 | Kang et al. | 714/752 |
| 2011/0107019 A1* | 5/2011 | Pan et al. | 711/104 |
| 2011/0134969 A1* | 6/2011 | Pisek et al. | 375/147 |
| 2011/0161782 A1* | 6/2011 | Engin | 714/763 |
| 2011/0205984 A1* | 8/2011 | Lee et al. | 370/329 |
| 2012/0054578 A1* | 3/2012 | Shen et al. | 714/755 |
| 2012/0106683 A1* | 5/2012 | Zhao | 375/341 |
| 2012/0208585 A1* | 8/2012 | Aoyagi et al. | 455/515 |

OTHER PUBLICATIONS

Myoung-Cheol Shin, et al., "SIMD Processor-Based Turbo Decoder Supporting Multiple Third-Generation Wireless Standards", IEEE Transactions on Very Large Scale Integration (VLSI) Systems, vol. 15, No. 7, Jul. 2007, p. 801-810.

International Search Report dated Aug. 29, 2011 in connection with International Patent Application No. PCT/KR2010/008136.

* cited by examiner

METHOD AND APPARATUS FOR PARALLEL PROCESSING TURBO DECODER

CROSS-REFERENCE TO RELATED APPLICATION(S) AND CLAIM OF PRIORITY

The present application is related to U.S. Provisional Patent Application No. 61/283,703, filed Dec. 8, 2009, entitled "METHOD AND APPARATUS FOR PARALLEL PROCESSING TURBO DECODER". Provisional Patent Application No. 61/283,703 is assigned to the assignee of the present application and is hereby incorporated by reference into the present application as if fully set forth herein. The present application hereby claims priority under 35 U.S.C. §119(e) to U.S. Provisional Patent Application No. 61/283, 703.

TECHNICAL FIELD OF THE INVENTION

The present application relates generally to wireless communications devices and, more specifically, to decoding data received by a wireless communication device.

BACKGROUND OF THE INVENTION

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC was impractical to implement when developed in 1963.

Turbo codes, discovered in 1993, became the coding scheme of choice in the late 1990s. Turbo codes are used for applications such as deep-space satellite communications. In modern modems designed for emerging high bit rate cellular standards such as Long Term Evolution (LTE) and LTE advanced (LTE/ADV), Turbo decoders pose the highest design complexity and consume the most power.

SUMMARY OF THE INVENTION

A receiver capable of decoding encoded transmissions is provided. The receiver includes a number of receive antennas configure to receive data; a plurality of memory units that store the received data; and a plurality of decoders configured to perform a Turbo decoding operation. Each of the plurality of decoders decodes at least a portion of the received data using at least a portion of a decoding matrix. The receiver also includes a data switch coupled between the plurality of decoders and the plurality of memory units. The data switch configured to vary a decode operation from an long term evolution (LTE) based operation to a Wideband Code Division Multiple Access (WCDMA) operation.

A decoder capable of decoding encoded transmissions is provided. The decoder includes a plurality of memory units that store data. The decoder also includes a plurality of unit decoders. Each of the plurality of unit includes a processor array and a plurality of instructions. A portion of the plurality of instructions is stored in an instruction controller. The plurality of instructions causes each of the unit decoders to perform a Turbo decoding operation and decode at least a portion of the received data using at least a portion of a decoding matrix. The decoder also includes a data switch coupled between the plurality of decoders and the plurality of memory units. The data switch is configured to vary a decode operation from an long term evolution (LTE) based operation to a Wideband Code Division Multiple Access (WCDMA) operation.

A method for decoding transmissions in a wireless communications network is provided. The method includes receiving a data transmission. The data is stored in a plurality of memory units. A plurality of decoders perform a parallel Turbo decoding operation. Each of the plurality decoders performs the parallel Turbo decoding in one of: a long term evolution (LTE) based operation to a Wideband Code Division Multiple Access (WCDMA) operation.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications device.

Figure 1:
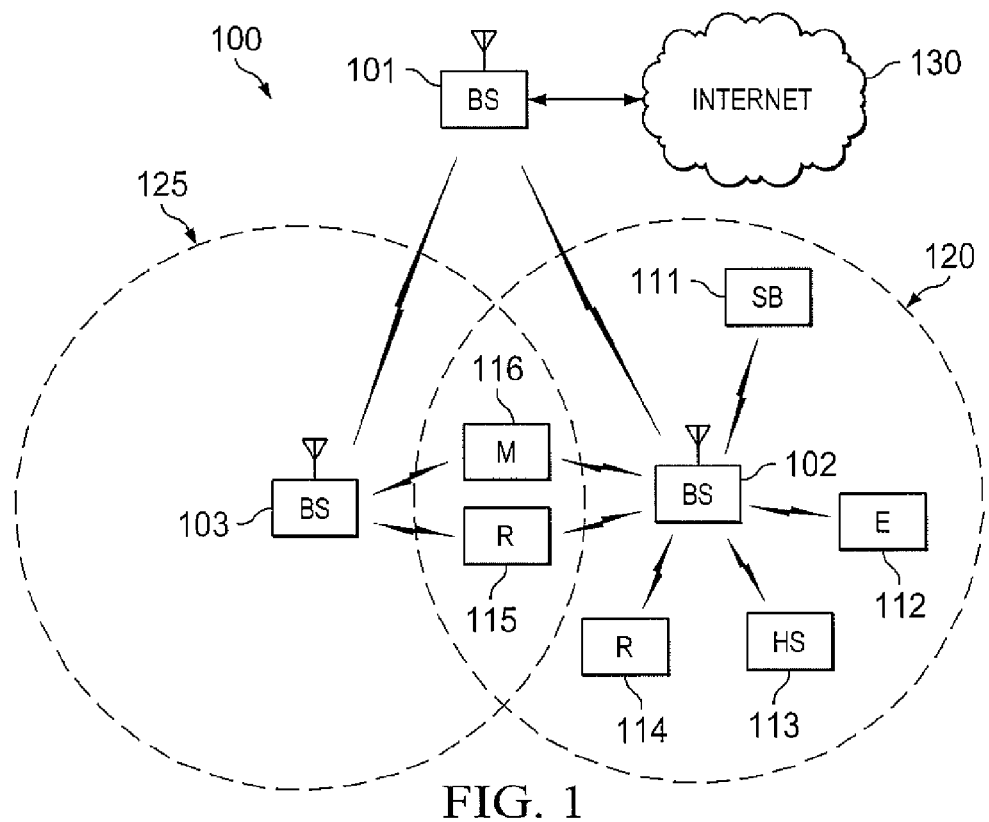
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
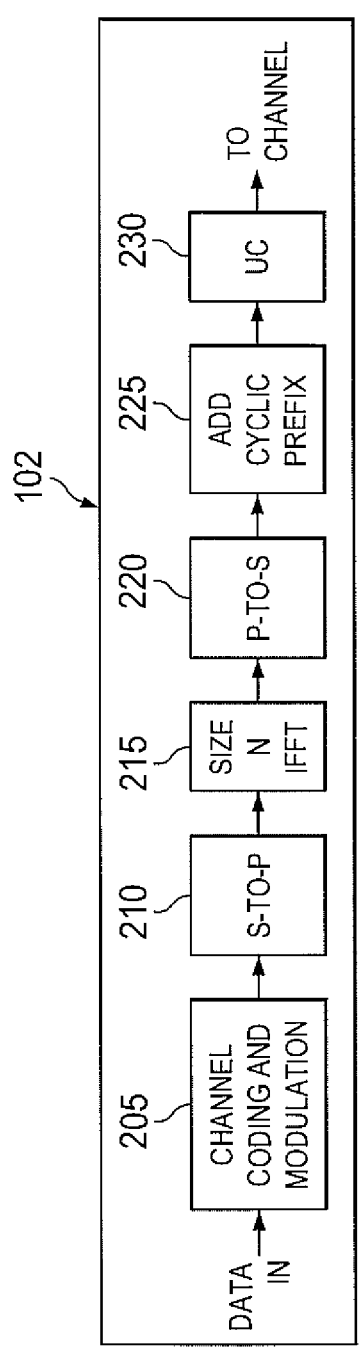
FIG. 2A illustrates a high-level diagram of an orthogonal frequency division multiple access transmit path according to an exemplary embodiment of the disclosure.
Figure 2B:
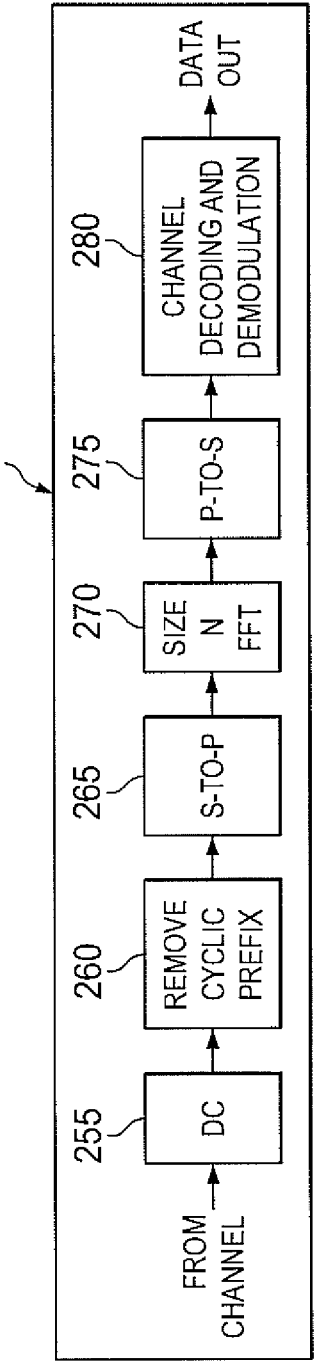
FIG. 2B illustrates a high-level diagram of an orthogonal frequency division multiple access receive path according to an exemplary embodiment of the disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., LDPC coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The channel decoding and demodulation block 280 decodes the received data. The channel decoding and demodulation block 280 includes a decoder configured to perform a Turbo decoding operation. In some embodiments, the channel decoding and demodulation block 280 comprises one or more Context-based operation Reconfigurable Instruction Set Processors (CRISPs) such as the CRISP processor described in one or more of application Ser. No. 11/123,313 filed May 6, 2005, entitled "CONTEXT-BASED OPERATION RECONFIGURABLE INSTRUCTION SET PROCESSOR AND METHOD OF OPERATION"; U.S. Pat. No. 7,483,933 issued Jan. 27, 2009 entitled "CORRELATION ARCHITECTURE FOR USE IN SOFTWARE-DEFINED RADIO SYSTEMS"; application Ser. No. 11/142,504 filed Jun. 1, 2005, entitled "MULTISTANDARD SDR ARCHITECTURE USING CONTEXT-BASED OPERATION RECONFIGURABLE INSTRUCTION SET PROCESSORS"; application Ser. No. 11/225,479, now U.S. Pat. No. 7,571,369, filed Sep. 13, 2005, entitled "TURBO CODE DECODER ARCHITECTURE FOR USE IN SOFTWARE-DEFINED RADIO SYSTEMS"; and application Ser. No. 11/501,577 filed Aug. 9, 2006, entitled "MULTI-CODE CORRELATION ARCHITECTURE FOR USE IN SOFTWARE-DEFINED RADIO SYSTEMS", all of which are hereby incorporated by reference into the present application as if fully set forth herein.

Figure 3:
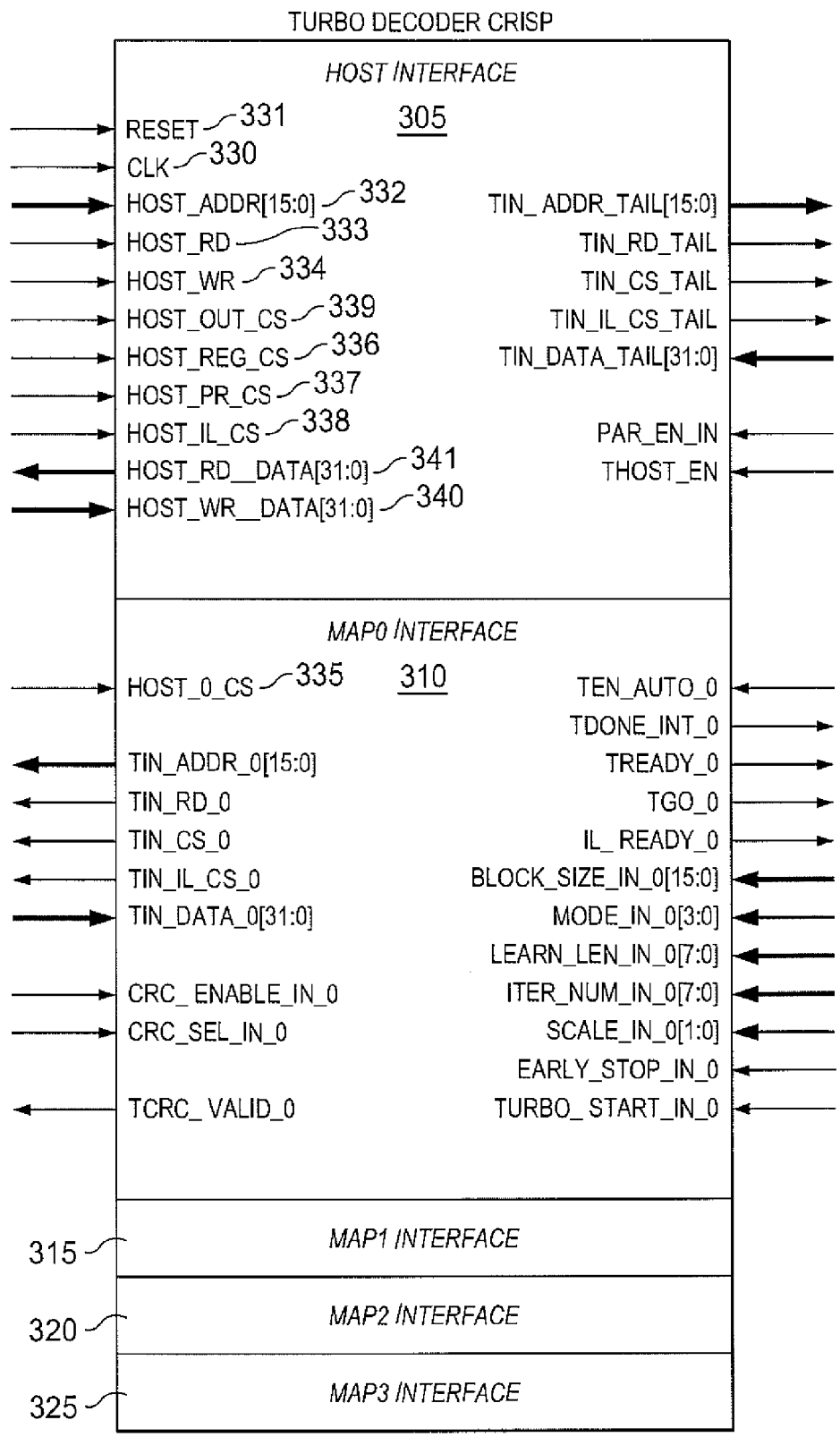
FIG. 3 illustrates a Turbo CRISP top-level architecture according to embodiments of the present disclosure.

FIG. 3 illustrates an example of a Turbo CRISP top-level architecture according to embodiments of the present disclosure. The embodiment of the Turbo CRISP top-level architecture 300 shown in FIG. 3 is for illustration only. Other embodiments of the Turbo CRISP top-level architecture 300 could be used without departing from the scope of this disclosure.

The example of the Turbo CRISP 300 shown in FIG. 3 is for illustration and example only and should not be construed as limiting. The Turbo CRISP 300 can include host interface 305 and multiple Maximum a posteriori (MAP) interfaces. In the example shown in FIG. 3, the interfaces for MAP0 310 are illustrated. Although the interfaces for MAP1 315, MAP2 320 and MAPS 325 are not depicted, those interfaces are the same as the MAP0 310 interfaces with signal names ending in _1, _2 and _3 respectively, instead of _0 as shown for MAP2. The host and MAP0 interfaces are described in Table 1:

TABLE 1

| Signal | Direction | Fixed Value | Description |
| --- | --- | --- | --- |
| CLK | IN | | Clock |
| RESET | IN | | Reset |
| HOST_ADDR[15:0] | IN | | Host Address |
| HOST_RD | IN | | Host Read Enable |

TABLE 1-continued

| Signal | Direction | Fixed Value | Description |
| --- | --- | --- | --- |
| HOST_WR | IN | GND | Host Write Enable |
| HOST_WR_DATA[31:0] | IN | GND | Host Write Data |
| HOST_RD_DATA[31:0] | OUT | | Host Read Data |
| HOST_0_CS | IN | | MAP0 Chip Select |
| HOST_1_CS | IN | | MAP1 Chip Select |
| HOST_2_CS | IN | | MAP2 Chip Select |
| HOST_3_CS | IN | | MAP3 Chip Select |
| HOST_REG_CS | IN | GND | Register Chip Select |
| HOST_PR_CS | IN | GND | Program Memory Chip Select |
| HOST_IL_CS | IN | GND | Interleaver Table Chip Select |
| HOST_OUT_CS | IN | | Output Buffer Chip Select |
| PAR_EN_IN | IN | VCC | Parallel Enable |
| THOST_EN | IN | GND | Ext. Host Enable |
| BLOCK_SIZE_IN_0[15:0] | IN | | MAP0 Block Size |
| MODE_IN_0[3:0] | IN | | MAP0 Mode Select |
| LEARN_LEN_IN_0[7:0] | IN | | MAP0 Learning Length |
| ITER_NUM_IN_0[7:0] | IN | | MAP0 No. of Iterations |
| SCALE_IN_0[1:0] | IN | | MAP0 Lambda Scaling |
| EARLY_STOP_IN_0 | IN | | MAP0 Early Stop Enable |
| TURBO_START_IN_0 | IN | | MAP0 Turbo Start |
| CRC_ENABLE_IN_0 | IN | | MAP0 CRC Enable |
| CRC_SEL_IN_0 | IN | | MAP0 CRC Type Select |
| TCRC_VALID_0 | OUT | | MAP0 CRC Valid |
| TIN_ADDR_0[15:0] | OUT | | MAP0 Input Data Address |
| TIN_RD_0 | OUT | | MAP0 Input Data Read Enable |
| TIN_CS_0 | OUT | | MAP0 Non-Interleaved Input Chip Select |
| TIN_IL_CS_0 | OUT | | MAP0 Interleaved Input Chip Select |
| TIN_DATA_0[31:0] | IN | | MAP0 Input Data |
| TDONE_INT_0 | OUT | | MAP0 Done Interrupt |
| TREADY_0 | OUT | | MAP0 Ready |
| TGO_0 | OUT | | MAP0 GO |
| IL_READY_0 | OUT | | I/L 0 Ready |
| TEN_AUTO_0 | IN | VCC | Process 0 enable |
| BLOCK_SIZE_IN_1[15:0] | IN | | MAP1 Block Size |
| MODE_IN_1[3:0] | IN | | MAP1 Mode Select |
| LEARN_LEN_IN_1[7:0] | IN | | MAP1 Learning Length |
| ITER_NUM_IN_1[7:0] | IN | | MAP1 No. of Iterations |
| SCALE_IN_1[1:0] | IN | | MAP1 Lambda Scaling |
| EARLY_STOP_IN_1 | IN | | MAP1 Early Stop Enable |
| TURBO_START_IN_1 | IN | | MAP1 Turbo Start |
| CRC_ENABLE_IN_1 | IN | | MAP1 CRC Enable |
| CRC_SEL_IN_1 | IN | | MAP1 CRC Type Select |
| TCRC_VALID_1 | OUT | | MAP1 CRC Valid |
| TIN_ADDR_1[15:0] | OUT | | MAP1 Input Data Address |
| TIN_RD_1 | OUT | | MAP1 Input Data Read Enable |
| TIN_CS_1 | OUT | | MAP1 Non-Interleaved Input Chip Select |

TABLE 1-continued

| Signal | Direction | Fixed Value | Description |
|---|---|---|---|
| TIN_IL_CS_1 | OUT | | MAP1 Interleaved Input Chip Select |
| TIN_DATA_1[31:0] | IN | | MAP1 Input Data |
| TDONE_INT_1 | OUT | | MAP1 Done Interrupt |
| TREADY_1 | OUT | | MAP1 Ready |
| TGO_1 | OUT | | MAP1 GO |
| IL_READY_1 | OUT | | I/L 1 Ready |
| TEN_AUTO_1 | IN | VCC | Process 1 enable |
| BLOCK_SIZE_IN_2[15:0] | IN | | MAP2 Block Size |
| MODE_IN_2[3:0] | IN | | MAP2 Mode Select |
| LEARN_LEN_IN_2[7:0] | IN | | MAP2 Learning Length |
| ITER_NUM_IN_2[7:0] | IN | | MAP2 No. of Iterations |
| SCALE_IN_2[1:0] | IN | | MAP2 Lambda Scaling |
| EARLY_STOP_IN_2 | IN | | MAP2 Early Stop Enable |
| TURBO_START_IN_2 | IN | | MAP2 Turbo Start |
| CRC_ENABLE_IN_2 | IN | | MAP2 CRC Enable |
| CRC_SEL_IN_2 | IN | | MAP2 CRC Type Select |
| TCRC_VALID_2 | OUT | | MAP2 CRC Valid |
| TIN_ADDR_2[15:0] | OUT | | MAP2 Input Data Address |
| TIN_RD_2 | OUT | | MAP2 Input Data Read Enable |
| TIN_CS_2 | OUT | | MAP2 Non-Interleaved Input Chip Select |
| TIN_IL_CS_2 | OUT | | MAP2 Interleaved Input Chip Select |
| TIN_DATA_2[31:0] | IN | | MAP2 Input Data |
| TDONE_INT_2 | OUT | | MAP2 Done Interrupt |
| TREADY_2 | OUT | | MAP2 Ready |
| TGO_2 | OUT | | MAP2 GO |
| IL_READY_2 | OUT | | I/L 2 Ready |
| TEN_AUTO_2 | IN | VCC | Process 2 enable |
| BLOCK_SIZE_IN_3[15:0] | IN | | MAP3 Block Size |
| MODE_IN_3[3:0] | IN | | MAP3 Mode Select |
| LEARN_LEN_IN_3[7:0] | IN | | MAP3 Learning Length |
| ITER_NUM_IN_3[7:0] | IN | | MAP3 No. of Iterations |
| SCALE_IN_3[1:0] | IN | | MAP3 Lambda Scaling |
| EARLY_STOP_IN_3 | IN | | MAP3 Early Stop Enable |
| TURBO_START_IN_3 | IN | | MAP3 Turbo Start |
| CRC_ENABLE_IN_3 | IN | | MAP3 CRC Enable |
| CRC_SEL_IN_3 | IN | | MAP3 CRC Type Select |
| TCRC_VALID_3 | OUT | | MAP3 CRC Valid |
| TIN_ADDR_3[15:0] | OUT | | MAP3 Input Data Address |
| TIN_RD_3 | OUT | | MAP3 Input Data Read Enable |
| TIN_CS_3 | OUT | | MAP3 Non-Interleaved Input Chip Select |
| TIN_IL_CS_3 | OUT | | MAP3 Interleaved Input Chip Select |
| TIN_DATA_3[31:0] | IN | | MAP3 Input Data |
| TDONE_INT_3 | OUT | | MAP3 Done Interrupt |
| TREADY_3 | OUT | | MAP3 Ready |
| TGO_3 | OUT | | MAP3 GO |
| IL_READY_3 | OUT | | I/L 3 Ready |
| TEN_AUTO_3 | IN | VCC | Process 3 enable |
| TIN_ADDR_TAIL[15:0] | OUT | | TAIL Input Data Address |
| TIN_RD_TAIL | OUT | | TAIL Input Data Read Enable |
| TIN_CS_TAIL | OUT | | TAIL Non-Interleaved Input Chip Select |
| TIN_IL_CS_TAIL | OUT | | TAIL Interleaved Input Chip Select |
| TIN_DATA_TAIL[31:0] | IN | | TAIL Input Data |

The rising edge of the clock signal (CLK) 330 is used to operate all synchronous logic in the Turbo CRISP 300. The reset signal 331 is an active high asynchronous reset. The reset signal 331 returns all logic and registers to their initial power-up values. Reset can be asserted at any time but should be de-asserted synchronously with the rising edge of the CLK signal 330.

The host 305 signals allow the external system or host processor (not shown) to communicate with the Turbo CRISP 300 for the purpose of writing and reading the configuration registers, program memory, interleaver memory, and output buffer memory. Two chip select signals are asserted to perform a read or write access. The first chip select indicates which MAP decoder 310-325 is being accessed, and the second indicates which address space within the selected MAP decoder 310-325 to access (register, program memory, interleaver memory, or output buffer memory).

The Host Address 332 is the offset address of the register or memory location which the host is accessing for a read or write operation.

The Host Read Enable 333 is the active high read enable signal. For example, if the Host asserts this signal for one clock cycle, the Turbo CRISP 300 will output valid data during the following clock cycle.

The Host Write Enable 334 is the active high write enable. For example, during a clock cycle where HOST_WR is asserted, the data on HOST_WR_DATA will be written to the memory or registers selected by the Chip Select signal and by HOST_ADDR.

The MAP0 Host Chip Select 335 is the active high chip select for Turbo CRISP MAP0 310. Asserting this signal enables the registers or memory in MAP0 310 to be read or written.

The MAP1 Host Chip Select is the active high chip select for Turbo CRISP MAP1 315. Asserting this signal enables the registers or memory in MAP1 315 to be read or written.

The MAP2 Host Chip Select is the active high chip select for Turbo CRISP MAP2 320. Asserting this signal enables the registers or memory in MAP2 320 to be read or written.

The MAP3 Host Chip Select is the active high chip select for Turbo CRISP MAP3 325. Asserting this signal enables the registers or memory in MAP3 to be read or written.

The Register Chip Select 336 is the active high chip select that indicates that the Host is accessing the register address space. The access will go to the MAP decoder selected by the active HOST_n_CS signal.

The Program Memory Chip Select 337 is the active high chip select that indicates that the Host is accessing the Program Memory address space. The access will go to the MAP decoder selected by the active HOST_n_CS signal.

The Interleaver Memory Chip Select 338 is the active high chip select that indicates that the Host is accessing the Interleaver Memory address space. The access will go to the MAP decoder selected by the active HOST_n_CS signal.

The Output Buffer Chip Select 339 is the active high chip select that indicates that the Host is accessing the Output Buffer address space. The access will go to the MAP decoder selected by the active HOST_n_CS signal.

The Host Write Data 340 is the Data that the host is writing to a register or memory. The data is written on the rising edge of CLK when HOST_WR is high.

The Turbo CRISP 300 outputs data on the Host Read Data 341 in any clock cycle assertion of HOST_RD.

The Turbo CRISP 300 includes internal buffers (not shown) that store the decoded hard bits. The buffers are accessed using the Host Address Bus. Each address accesses a 32-bit little endian word of decoded data.

Figure 4:
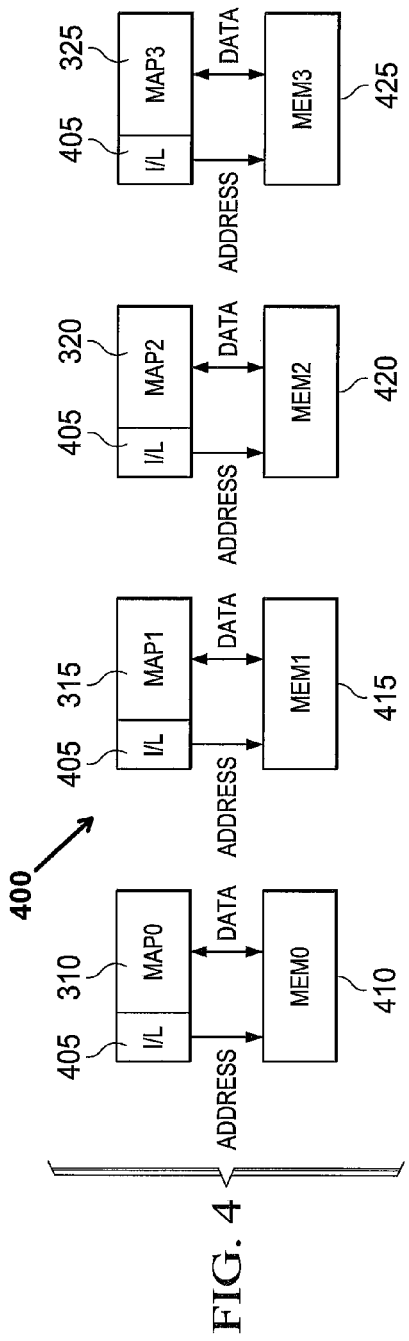
FIG. 4 illustrates an example decoder 400 with duplicated MAPS.

FIG. 4 illustrates an example decoder 400 with duplicated MAPS. The decoder 400 can be used for decoding in a Wideband Code Division Multiple Access (WCDMA) environment. In the example shown in FIG. 4, the decoder 400 includes four MAPs decoders. The decoder 400 includes a single interleaver (I/L) 405 for the MAPS 310-325. Each MAP 310-325 is coupled to a single respective memory unit 410-425 for an independent operation. That is, each MAP 310-325 uses the respective memory unit 410-425 to which the MAP 310-325 is coupled. For example, MAP0 310 is coupled to and uses Mem0 410, MAP1 315 is coupled to and uses Mem1 415, MAP2 320 is coupled to and uses Mem2 420 and MAP3 325 is coupled to and uses Mem3 425. Each MAP 310-325 processes a separate block of data. Therefore, multiple blocks are processed in parallel. However, a Turbo decoder is a block code and dividing a single block to several sub blocks (1 sub block per 1 MAP decoder) can introduce Bit Error Rate/Frame Error Rate (BER/FER) performance degradation to the overall block. Latency also can occur as a result of buffering four blocks that have to be released together. For example, each memory 410-415 is required to buffer blocks until all the blocks are processed and ready to be released.

Turbo Decoders for LTE standard are required to achieve high bit rate (up to 300 Mbps for Cat. 5 3GPP release 8 LTE and up to 1 Gbps for 3GPP Rel. 10 LTE/ADV). In order to achieve this high bit rate a quadratic permutation polynomial (QPP) interleaver enables parallel processing Turbo Decoder. Using the QPP interleaver enabled LTE Turbo Decoding to easily perform multiple MAP decoders over a single data block in parallel (illustrated further herein below with respect to FIGS. 6 and 13).

Embodiments of the present disclosure provide new architectures to allow parallel processing of multiple MAP decoders (M) to process simultaneously with no performance degradation. In addition, embodiments of the present disclosure provide an efficient QPP I/L cell architecture to allow efficient parallel processing Turbo Decoder and discloses methods that utilize the disclosed QPP I/L HW cell in a system that uses parallel MAP decoder machines to process a single block with size k.

Figure 5:
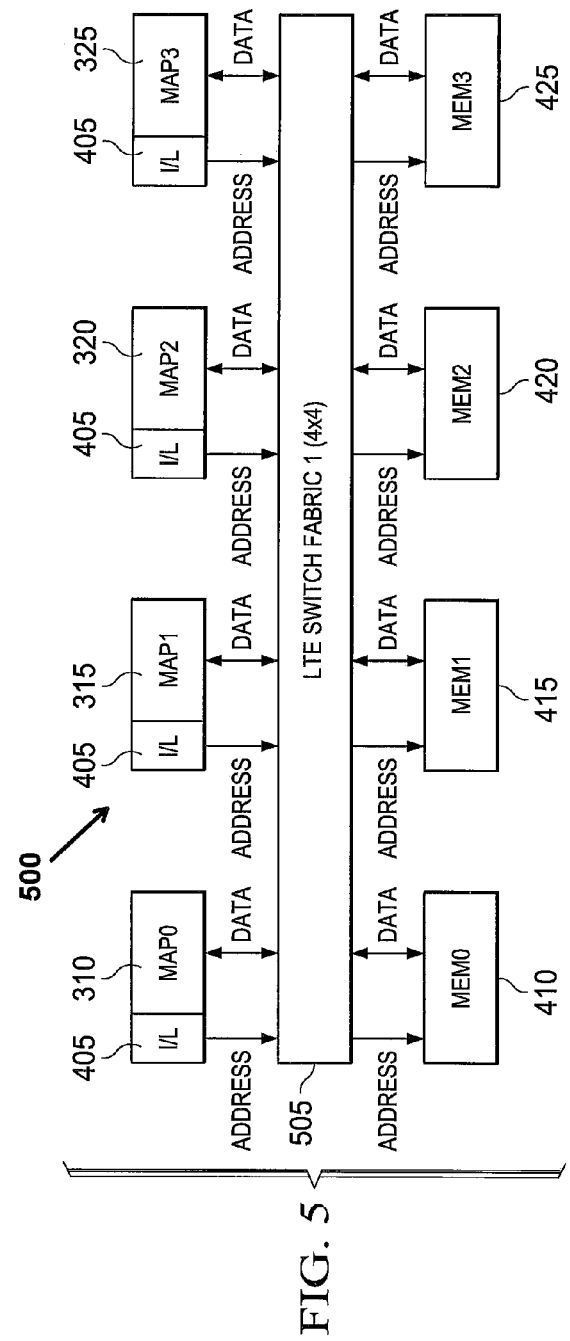
FIG. 5 illustrates a decoder 500 that includes a parallel processing LTE switch fabric according to embodiments of the present disclosure.

FIG. 5 illustrates a decoder 500 that includes a parallel processing LTE switch fabric according to embodiments of the present disclosure. The embodiment of the decoder 500 shown in FIG. 5 is for illustration only. Other embodiments could be used without departing from the scope of this disclosure.

The decoder 500 includes a number of I/L blocks 405, a number of MAP decoders 310-325 and a number of memory blocks 410-425. The decoder 500 further includes an LTE switch fabric 505.

The decoder 500 is capable of performing parallel processing over single block in order to significantly reduce memory and processing delay (and significantly reduce power) as compared to the duplicated MAP architecture decoder 400 that includes multiple MAP decoders 310-325 processing multiple blocks in parallel. The decoder 500 also is capable of operating in a WCDMA environment or an LTE environment.

For example, the decoder 500 is capable of switching itself between modes of operation for WCDMA and LTE. The LTE switch fabric 505 can be enabled to perform switching for parallel processing or disabled such that the decoder 500 operates in a manner similar to the decoder 400. In the LTE mode of operation, the switch fabric 505 can be configured to enable each MAP decoder 310-325 to decode independently using a respective one of the memory units 410-425. In addition, in the LTE mode of operation, the switch fabric 505 can be configured to enable each MAP decoder 310-325 to decode in parallel using cross connections to one or more of the memory units 410-425. The switch fabric 505 is configured to synchronize operations such that each MAP decoder 310-325 receives one or two bits (e.g., two data bits from one memory unit or one data bit from two memory units) without conflicting with operation from another of the MAP decoders 310-325. As such, the switch fabric 505 is configured to maintain contention free operations from each MAP decoder 310-325.

Each of the MAP decoders 310-325 includes a number of interfaces adapted to receive a number of signals. These signals are used by the Turbo CRISP to read encoded symbols from an external memory buffer. Each MAP decoder 310-325 Interface (including the Tail) has a set of identical signals as shown in Table 2 (and shown in FIG. 3):

TABLE 2

| Signal | Direction | Description |
| --- | --- | --- |
| TIN_ADDR[15:0] | OUT | Input Data Address: The address of the input symbols which the Turbo CRISP is reading from the input buffer. |
| TIN_RD | OUT | Input Data Read Enable: Active high read enable which indicates that the Turbo CRISP is reading from the input buffer. |
| TIN_CS | OUT | Non-Interleaved Input Chip Select: Active high chip select for the non-interleaved input symbols. |
| TIN_IL_CS | OUT | Interleaved Input Chip Select: Active high chip select for the interleaved input symbols. |
| TIN_DATA[31:0] | IN | Input Data: Symbol data from the input buffer. The Turbo CRISP samples this data on the rising edge of CLK when TIN_RD is asserted. The data format is shown in Section Error! Reference source not found . . . |

Each of the MAP decoders 310-325 also includes control inputs that receive signals to control or activate the Turbo CRISP, as described in Table 3 (and shown in FIG. 3):

TABLE 3

| Signal | Direction | Description |
| --- | --- | --- |
| BLOCK_SIZE_IN[15:0] | IN | Block Size - defines the Turbo block size in bits |

TABLE 3-continued

| Signal | Direction | Description |
|---|---|---|
| MODE_IN[3:0] | IN | Mode Select - selects the mode for the Trubo CRISP to run:<br>1 - WCDMA<br>2 - LTE<br>Otherwise - Reserved |
| LEARN_LEN_IN[7:0] | IN | Learning Length - defines the learning length in pairs in case of segmentation (WCDMA or LTE) or Parallel processing (LTE) |
| ITER_NUM_IN[7:0] | IN | No. of Iterations - defines the number of half iterations to run (8'h0 means 1 half iteration and so on) |
| SCALE_IN[1:0] | IN | Lambda Scaling - defines the lambda scaling factor (both MAPs):<br>0 - No scaling<br>1 - 0.875<br>2 - 0.75<br>3 - 0.5 |
| EARLY_STOP_IN | IN | Early Stop Enable - enables the hard early stopping |
| CRC_ENABLE_IN | IN | CRC Enable - enables the CRC Checking mode (only when Early Stop is enabled)* |
| CRC_SEL_IN | IN | CRC Select - selects the type of CRC to use:<br>0 - CRC-A<br>1 - CRC-B |
| TURBO_START_IN | IN | Turbo Start - starts the Turbo Decoder |
| PAR_EN_IN | IN | Parallel processing Enable |
| TEN_AUTO | IN | Turbo Automatic Enable: Active high input which can be used to activate the CRISP and start the decoding process. |

Each of the MAP decoders 310-325, memories 410-425 and the LTE switch is responsive to a shared Parallel processing enable 510 (shown in FIG. 3). The parallel processing enable 510 can set LTE switch fabric 505 to not switch for WCDMA applications and to vary from a switch disabled to a switch enabled in LTE applications. The parallel processing enable 510 sets the LTE switch fabric 505 based on a signal received by the parallel processing enable 510. In some embodiments, the parallel processing enable 510 sets the LTE switch fabric 505 based on the received signal and a corresponding block size. For example, the parallel processing enable 510 can set the LTE switch fabric 505 based on Table 4. It will be understood that the block sizes shown in Table 4 are for illustration only and other block sizes could be used for each setting without departing from the scope of this disclosure.

TABLE 4

| | WCDMA | | LTE | | | |
|---|---|---|---|---|---|---|
| PAR_EN_IN = 0 | No Switch | <512<br>No<br>Switch Seg = 1 | <896<br>No<br>Switch<br>Seg = 2 | <1792<br>No<br>Switch<br>Seg = 4 | <3584<br>No<br>Switch<br>Seg = 8 | <=6144<br>No<br>Switch<br>Seg = 16 |
| PAR_EN_IN = 1 | No Switch | <512<br>No<br>Switch Seg = 1 | <1024<br>No<br>Switch<br>Seg = 2<br>(<896),<br>Seg = 4<br>(<1024) | <1792<br>Switch<br>Seg = 1 | <3584<br>Switch<br>Seg = 2 | <=6144<br>Switch<br>Seg = 4 |

As illustrated in the example shown in Table 4, when the block size is 512, the LTE switch fabric 505 is disabled and the MAP decoders 310-325 process the blocks directly. When the block size is 896, the LTE switch fabric 505 is disabled and the MAP decoders 310-325 segment the blocks into two segments. For example, for MAP0 310, a block is segmented into two blocks of 448 in memory 410. Then, MAP0 310 processes the block twice by processing the first segment in a first operation and the second segment in a second operation. Segmenting can be increased for larger sized blocks. One example of segmenting is illustrated by Table 5 (WCDMA Segmentation):

TABLE 5

| | Block Size Range (bits) | | | | |
|---|---|---|---|---|---|
| | 40-509 | 510-895 | 896-1791 | 1792-3583 | 3584-5114 |
| No. of Segments | 1 | 2 | 4 | 8 | 16 |

However, at a specified size or value, or some other predetermined condition, the LTE switch fabric 505 is enabled. For example, when the block size is 1792, the LTE switch fabric 505 is enabled and the MAP decoders 310-325 process the blocks using memories 410-425. Then, each of the MAP decoders 310-325 can process a portion of the block, such as a sub-block of 448, using any one or more of memories 410-425. In addition, larger block sizes also can be segmented such as when the block size is 6144. The LTE switch fabric 505 is enabled and the MAP decoders 310-325 segment the blocks into four segments. Then, each of the MAP decoders 310-325 can process a portion of the block in segments using any one or more of memories 410-425. For example, MAP0 can process a sub-block of 1536 in four segments of 384 using any one or more of memories 410-425. MAP0 310 processes the block four times by processing the first segment in a first operation, the second segment in a second operation, the third segment in a third operation and the fourth segment in a fourth operation.

The parallel MAP decoders 310-325 process a single block. Some embodiments of the Turbo CRISP decoder 300 disclosed herein rely upon the learning period of Beta at the end of each sub block to write the first segment of the next sub block and also add learning Alpha at the beginning of each sub block as shown in FIGS. 6 through 11 and referred to as LTE Option 1. In some embodiments, the Turbo CRISP decoder 300 also support Cascading of Alpha/Beta values between consecutive sub blocks. Cascading is not required, which is a big advantage in gate count, but processing power may increase due to the overlapped segment processing.

Figure 6:
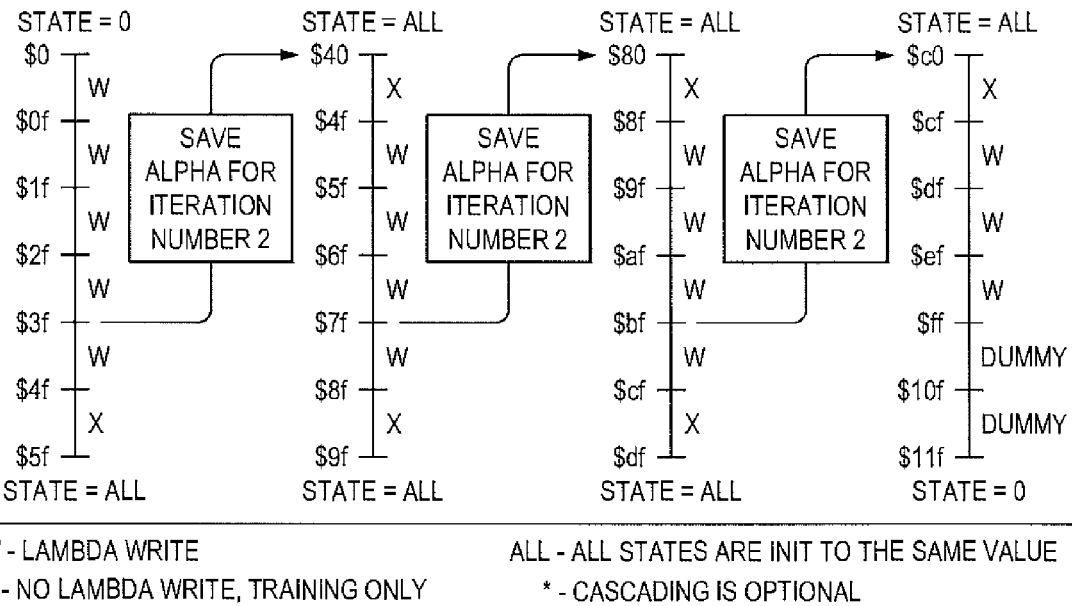
FIGS. 6 through 13 illustrate alpha and beta iterations according to embodiments of the present disclosure.
Figure 7:
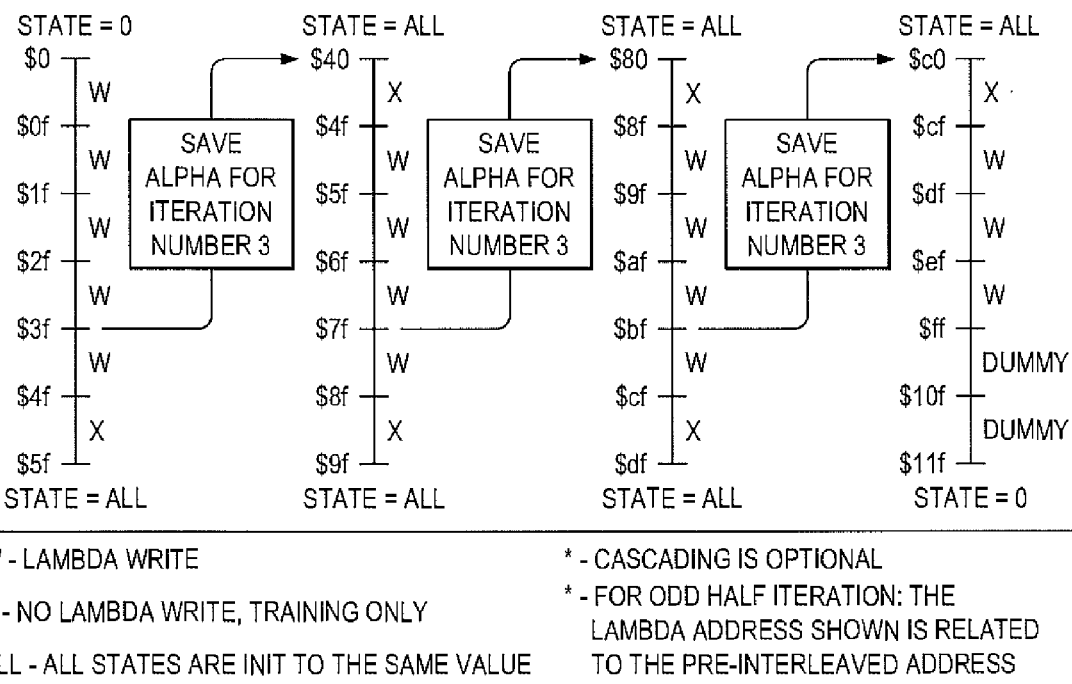
Figure 8:
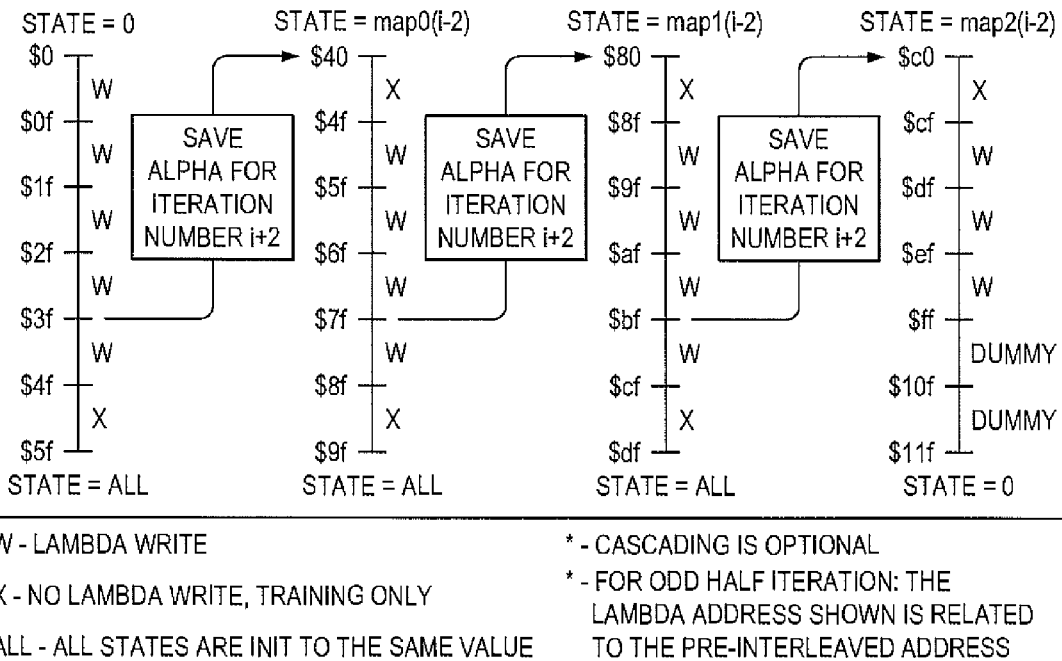
Figure 9:
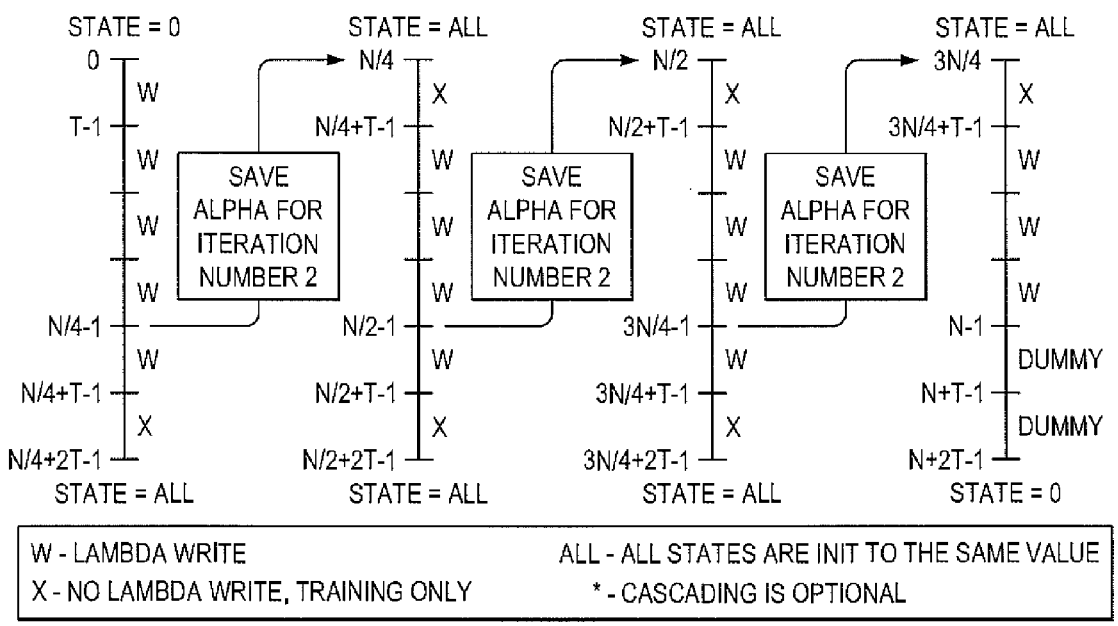
Figure 10:
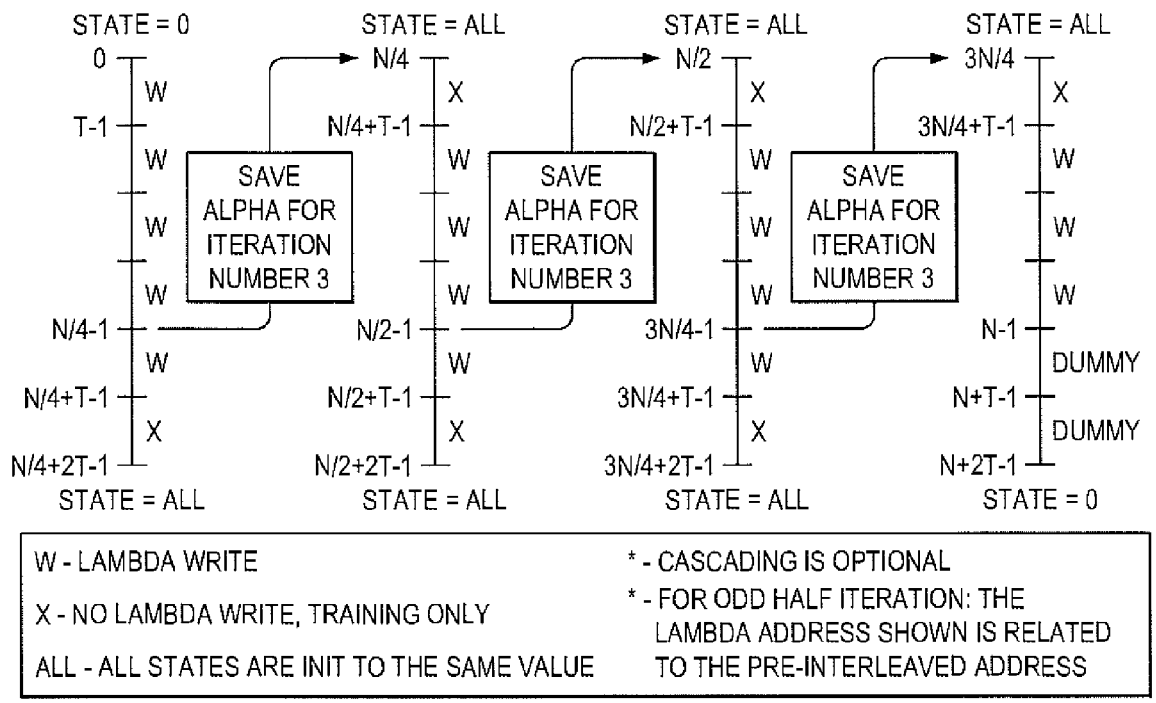
Figure 11:
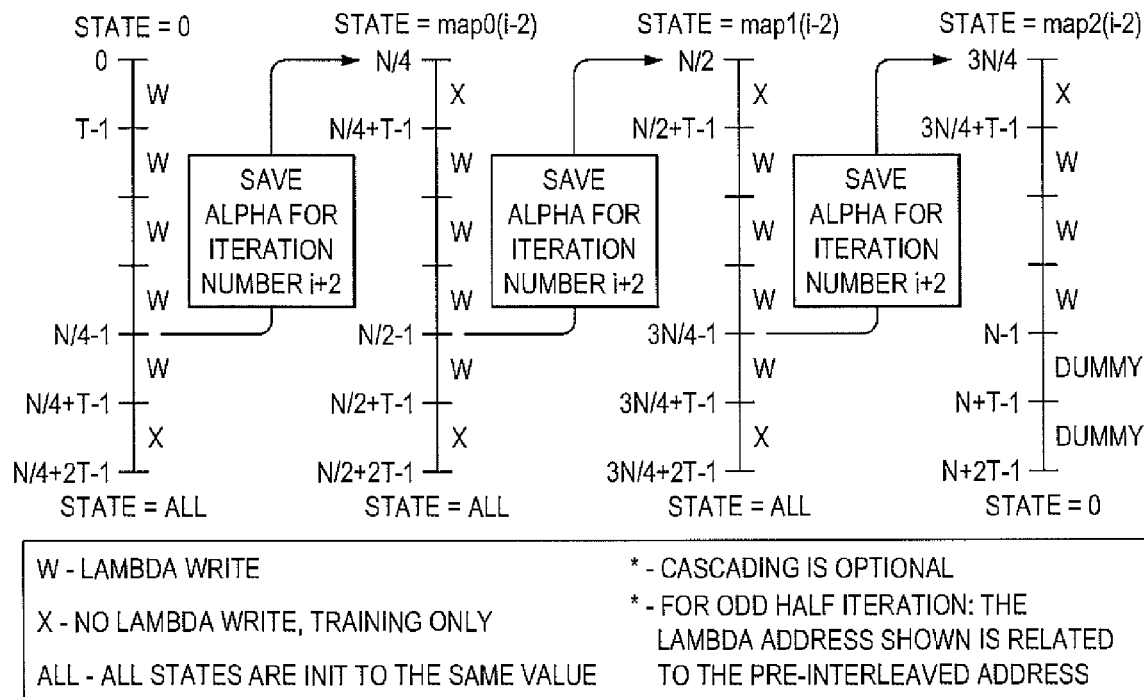

FIGS. 6 through 8 illustrate how the Turbo CRISP decoder 300 processes a 256-bit block size using the four MAP decoders 310-325 working in parallel. FIG. 6 illustrates an LTE 256-bit Half Iteration #0. FIG. 7 illustrates an LTE 256-bit Half Iteration #1. FIG. 6 illustrates an LTE 256-bit Half Iteration ≥2. Each MAP decoder 310-325 processes (256/4=64) bits plus a tail for training. In the examples shown in FIGS. 6 through 8, the tail is 16+16=32 bits; W is a Lambda write; X is a no-Lambda write; and ALL illustrates that all states are initialized to the same value.

While the first 16 bits are used to write the Lambda (λ) (using the alpha (α) from the previous MAP) the other 16 are just used for beta (β) training. Cascading of Alpha is optional in this case. For odd half iteration, the Lambda address shown is related to the pre-interleaved address.

In some embodiments, the Turbo CRISP decoder 300, when initializing the cascading in the first two-half iterations (Non-I/L and I/L sessions), initializes with the ALL state for both sessions, which may still result with performance degradation over the full block processing. In the ALL state all states are initialized to the same value. In some embodiments, the Turbo CRISP decoder 300, before processing the block, executes a small learning period over the border between each of two sub-blocks and records the Alpha and/or Beta state values per each first two-half iterations. The Turbo CRISP decoder 300 uses those values to initialize the cascading.

Using LTE Option 1, the Turbo CRISP decoder 300 does not require alpha cascading between the MAPs. Both alpha and beta include a learning period (with alpha/beta cascading as optional). However, for the system to keep in sync between all MAP decoders 310-325, the learning period is in the same size of the segment. In most cases, learning period can be much smaller than one segment with no performance degradation.

Figure 12:
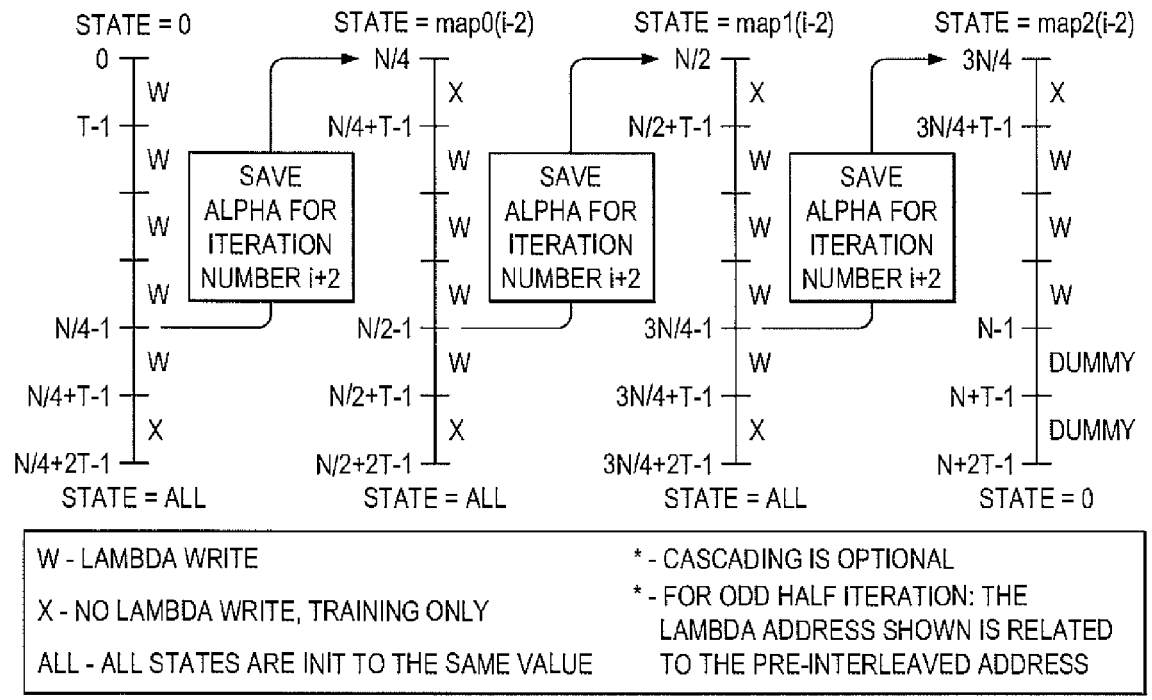
Figure 13:
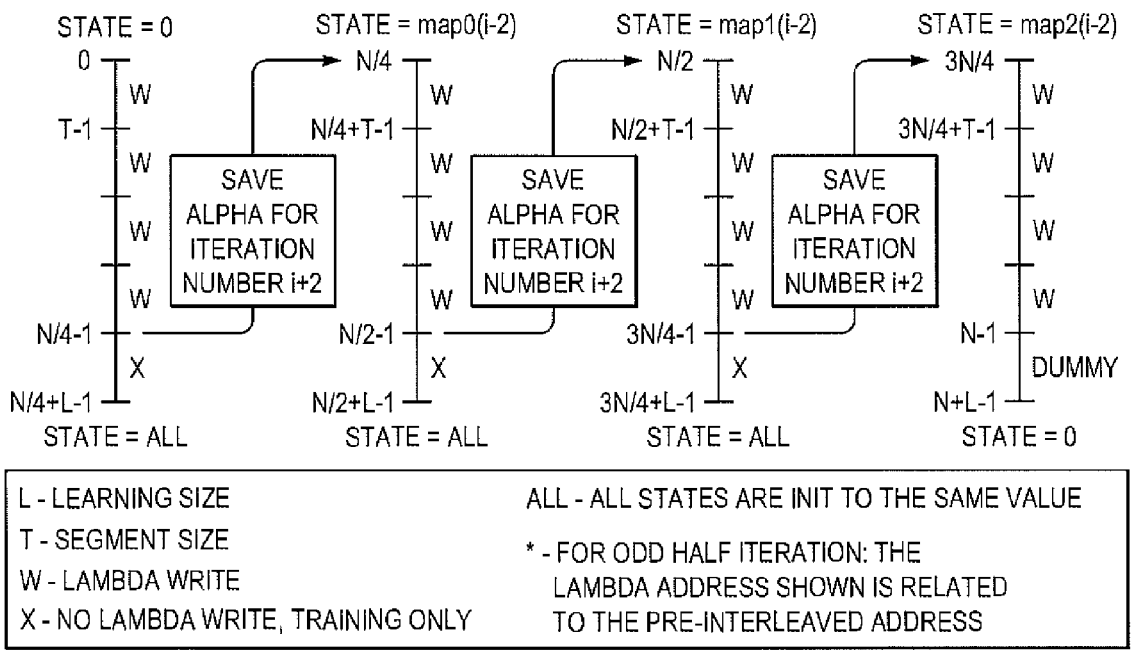

Some embodiments of the Turbo CRISP decoder 300 disclosed herein rely upon cascading between sub-blocks as shown in FIGS. 12 through 13 also referred to as LTE Option 2. The cascading can be Alpha only cascading, Beta only cascading, or both. Cascading means that the init Alpha/Beta per each sub block comes from a previous full iteration from previous/next sub block last state values. Different state values may exist for non I/L session and for I/L sessions; therefore, the states are saved in both sessions separately. By cascading between sub-blocks, the BER/FER performance can be regained back as processing the full block.

Here, each MAP decoder 310-325 processes N/4 bits plus tail for learning. For example, in FIG. 12, the training period is 32 bits. Cascading is connected in order to maintain reliable alpha values in the beginning of each MAP processing. LTE Option 2 allows any size of learning period (L) regardless of the segment size (T) and, thus, avoids the big learning period as in LTE Option 1.

In order to ensure contention-free with no overhead, the MAP decoders 310-325 work concurrently and in Sync. The MAP decoders 310-325 start at the same time (tgo=1 for all simultaneously). Due to the parallel processing with no delays between the MAP decoders 310-325, even when using cascading, for the first two-half iterations, MAP1 315, MAP2 320, and MAP3 325 start with init_state=All for alpha processing. MAP0 310 Alpha processing initializes to state=0. Beta processing init_state is equal All for MAP0 310, MAP1 315, and MAP2 320. MAP3 325 Beta processing initializes to state=0. When each MAP decoder 310-325 processes more than one segment, the beta learning period in the previous MAP is already performed on the new beta calculated in the next MAP.

The Turbo CRISP decoder 300 performs Beyond Sub Block-Synchronous parallel processing. In order to maintain synchronous processing between the MAP decoders 310-325 and due to tail bits in the end of the block, the last MAP decoder, such MAP3 325 that processes the last Subblock, performs special processing on tail bits and is maintained in sync with the rest of the MAP decoders, such as MAP decoders 310-320, without interfering the rest of the MAP decoders, such as MAP decoders 310-320.

For Lambda addresses above block size: The I/L Table/machine will wrap around to 0, adding the block size value. For example: in case of 256 bit block size, address 16'h0000 will become 16'h0100. The WR switch detects those cases and will not switch them to any memory block (no real write will occur). It is optional to write to extra logic. The RD switch detects those cases and will place strong "0" values (such as 16'h0180) on the reading bus if it is not a tail bit. In case of tail bits, the RD switch will put 16'h0000 on the reading bus. The six tail bit addresses (in the case of 256 bits, the 3 identity addresses ($100,$0101,$0102) for non-I/L, and the first 3 addresses of the I/L table for the I/L plus 16'h0100), are detected. It is also optional to read from extra logic.

The input buffer to the 4-MAP solution is divided to four sub-blocks that are addressed the same way as the non-interleaved extrinsic memories. The input switch differs from the extrinsic (lambda) switch by sequentially accessing the data (non-interleaved) memories. The same consideration is taken in case of beyond block size. Beyond Block size data will be fixed to strong "0" ($7F). A special tail input memory can be implemented separately (a fifth memory in a four MAP solution).

Figure 14:
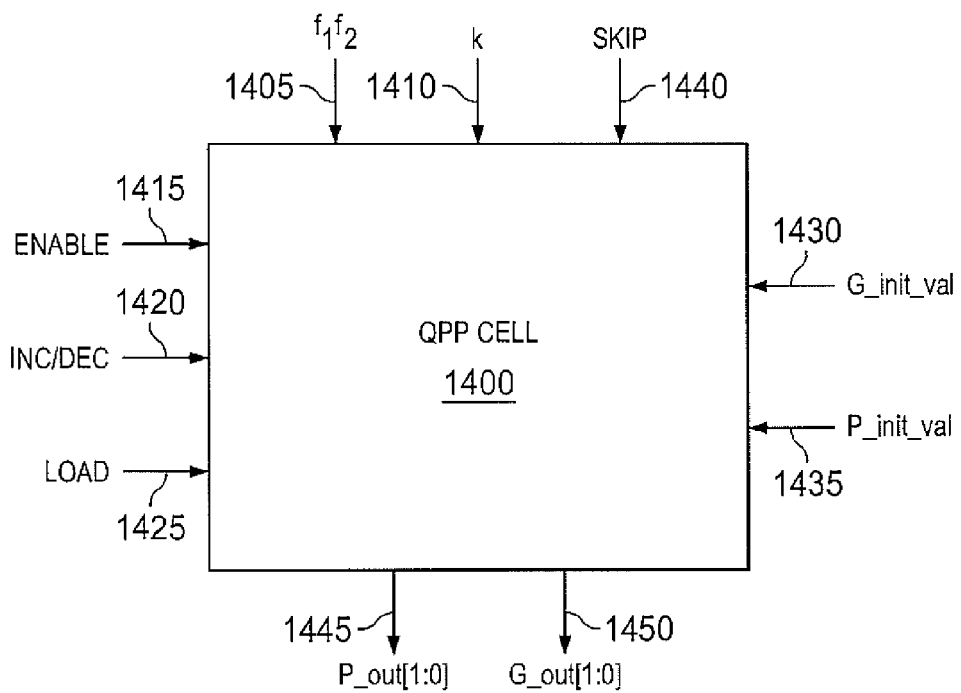
FIG. 14 illustrates a QPP cell according to embodiments of the present disclosure.

FIG. 14 illustrates a QPP cell according to embodiments of the present disclosure. The embodiment of the QPP cell 1400 shown in FIG. 14 is for illustration only. Other embodiments could be used without departing from the scope of this disclosure.

In some embodiments, a QPP I/L machine supports the LTE parallel processing Turbo decoder 300. The QPP I/L is implemented in hardware and, as such, can save memory in the handset (especially in the case of parallel processing to achieve 50 Mbps bit rate) as well as saving DSP calculations.

The QPP I/L is based on the following. Given an information block length K, the x-th interleaved output is read from an address given by Equation 1:

$$\Pi(x) = f_1 x + f_2 x^2 \bmod K \quad \text{[Eqn. 1]}$$

where 0≤x, f1, f2<K. If K is a multiple of '8', then the greatest common divisor of f1 and K should be '1' and any prime factor of K should also divide f2. For example, let K=320=26×5, then f1 should not be a multiple of '2' or '5' and f2 is a multiple of 2×5=10. The QPP I/L for this block size is given by Π(x)=19x+40x² mod 320.

The QPP I/L addresses can be computed recursively without multiplication or modulo operations. A simplified illustration is shown in Equations 2 and 3:

$$\begin{aligned}
\Pi(x+1) &= f_1(x+1) + f_2(x+1)^2 &&\bmod K \quad \text{[Eqn. 2]}\\
&= (f_1 x + f_2 x^2) + (f_1 + f_2 + 2f_2 x) &&\bmod K\\
&= \Pi(x) + g(x) &&\bmod K
\end{aligned}$$

where $g(x) \equiv f1+f2+2f2 \times \bmod K$ can also be computed recursively; and $$g(x+1) = g(x) + 2f_2 \bmod K \quad [\text{Eqn. 3}]$$

Since both Π(x) and g(x) are smaller than K, the modulo operations in Equations 2 and 3 can be replaced by comparisons.

For any M that divides K, contention-free parallel decoding with M decoders is supported by the QPP I/L. Let K=MW be an integer factorization of K. For any 0≤t≠v<M, the interleaving and de-interleaving addresses satisfy Equation 4:

$$\left\lfloor \frac{\Pi^{\pm 1}(x+tW)}{W} \right\rfloor \neq \left\lfloor \frac{\Pi^{\pm 1}(x+vW)}{W} \right\rfloor \quad [\text{Eqn. 4}]$$

That is, soft values in M different memory banks (each of size W) can be accessed by M different processors simultaneously without contention. In addition, an identical address can be used to access the soft values within all memory banks per Equation 5:

$$\begin{aligned} \Pi(x+tW) \bmod W &= f_1(x+tW) + f_2(x+tW)^2 & \bmod W \quad [\text{Eqn. 5}] \\ &= (f_1 x + f_2 x^2) + (f_1 t + 2f_2 tx + f_2 t^2 W)W & \bmod W \\ &= \Pi(x) & \bmod W \end{aligned}$$

The QPP cell 1400 is a fundamental hardware block that performs the QPP I/L. The QPP cell 1400 includes multiple inputs 1405-1440.

A first input 1405 is configured to receive f1 and f2 and a second input 1410 is configured to receive k. The f1, f2 data can come as separate f1 and f2 or already in another format such as f1+f2 and 2*f2 to reduce the calculation complexity. f1, f2 and k all may come from a table.

Control signals are received via inputs for enable 1415, increment decrement (inc/dec) 1420 and load 1425. The enable 1415, inc/dec 1420 and load 1425 signals determine the operation of the QPP cell 1400. When the enable 1415 signal is off, then no change in the logic is performed. When the enable 1415 signal is on, the QPP state (P and G internal registers) is incremented or decremented based on the inc/dec 1420 signal. QPP increment can be used in an Alpha session while QPP decrement can be used in a Beta session of the Turbo decoding.

Initial values for P and G interal registers are received via inputs for P_init_val 1430 and G_init_val 1435. When the load 1425 signal is on, the P_init_val 1430 data and G_init_val 1435 data are loaded to the internal P and G registers respectively. The P_init_val 1430 data and G_init_val 1435 signals are used to load and restore a certain state to the QPP I/L (windowing support is illustrated further herein below).

The QPP cell 1400 also includes an input for skip data 1440 to receive a skip data signal. The skip data signal received in the skip data 1440 determines by how much the QPP skips between consecutive outputs, which required to increase the Turbo decoder 300 bit rate support without the need for double buffering.

The QPP cell 1400 also includes outputs 1445, 1450 for P_out and G_out. The P_out 1445 can be the final output from the QPP cell 1400. However, both outputs 1445, 1450 are used to save and restore states in case of segmentation and windowing (such as, a learning period) where overlapped segments are processed to save alpha memory or parallel processing. The saved P_out and G_out values will be restored and loaded through the P_init_val and G_init_val respectively to restore the QPP state.

Figure 15:
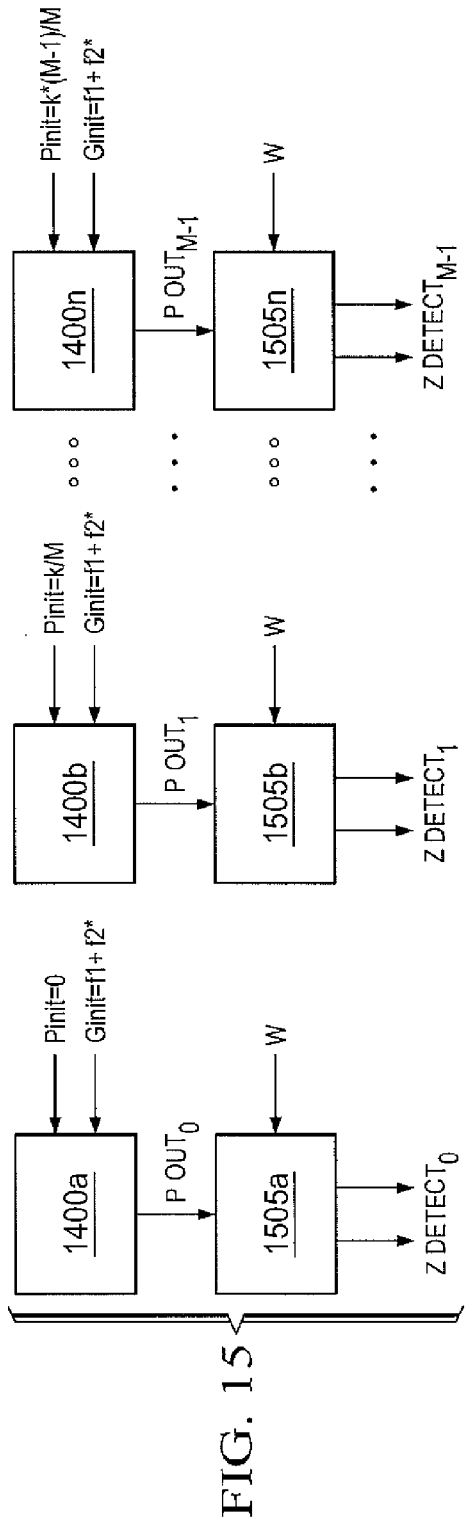
FIG. 15 illustrates an example operation of parallel QPP cells 1400 according to embodiments of the present disclosure.

FIG. 15 illustrates an example operation of parallel QPP cells 1400 according to embodiments of the present disclosure.

The embodiment of the QPP cells 1400 shown in FIG. 15 is for illustration only. Other embodiments could be used without departing from the scope of this disclosure.

In some embodiments, multiple QPP Interleavers are connected to Multiple MAP decoders to support the parallel processing necessary to achieve 50/100 Mbps for LTE. The QPP-based parallel LTE MAP decoders machines are implemented for a single block of size k-bit. Assuming k=M*W where both M and W are whole numbers, the number of parallel machines that can process the k-bit block can be equal to M. When connecting M Map decoders for each one, a QPP I/L cell 1400 is attached, each QPP I/L is initialized with the related P_init_val 1430 and G_init_val 1435 values as described in FIG. 14. The related P_out data 1445 is then compared to different multiplications (0 to M−1) of k/M=W to check to which memory bank 1505a-1505n the QPP cell 1400 interleaver is pointing. The result is written to Bank_sel. The related Bank_sel signal is used to control the M×M data switch described in further detail with respect to FIG. 16.

For example, on each parallel QPP Cell 1400a-1400n increment or decrement cycle, each Bank_sel signal points to a different (no repetition) Lambda memory bank 1505a-1505n out of the M possible Lambda Memory Banks (0:M−1). In each cycle, there is only one Bank_sel that points to Memory Bank 0 (Bank_sel=0). The related Z_detect signal is set for the Bank_sel=0. The related P_out that points to Bank_sel=0 (Z_detect is set), is used as the address (Mem_addr) to all the memory banks. That is, Mem_addr=P_out$_n$, when Bank_sel$_n$=0 (Z_detect$_n$=1). In some embodiments, Mem_addr is derived by using P_out$_0$ and Bank_sel$_0$. The order of the P_init is based on the Interleaver table (based on f1 and f2 parameters per block size) and the number of processors. For example, as shown in Table 6, for 4 processing elements (MAP decoders) there are two possible orders for P_init (n is block size):

TABLE 6

| | Processor No. | | | |
|---|---|---|---|---|
| | MAP0 | MAP1 | MAP2 | MAP3 |
| Option1 | 0 | n/4 | n/2 | 3n/4 |
| Option2 | 0 | 3n/4 | n/2 | n/4 |

Table 7 illustrates eight MP processing elements (4 options):

TABLE 7

| Proc No. | MAP0 | MAP1 | MAP2 | MAP3 | MAP4 | MAP5 | MAP6 | MAP7 |
|---|---|---|---|---|---|---|---|---|
| Option1 | 0 | n/8 | n/4 | 3n/8 | n/2 | 5n/8 | 3n/4 | 7n/8 |
| Option2 | 0 | 3n/8 | 3n/4 | n/8 | n/2 | 7n/8 | n/4 | 5n/8 |

TABLE 7-continued

| Proc No. | MAP0 | MAP1 | MAP2 | MAP3 | MAP4 | MAP5 | MAP6 | MAP7 |
|---|---|---|---|---|---|---|---|---|
| Option3 | 0 | 5n/8 | n/4 | 7n/8 | n/2 | n/8 | 3n/4 | 3n/8 |
| Option4 | 0 | 7n/8 | 3n/4 | 5n/8 | n/2 | 3n/8 | n/4 | n/8 |

Figure 16:
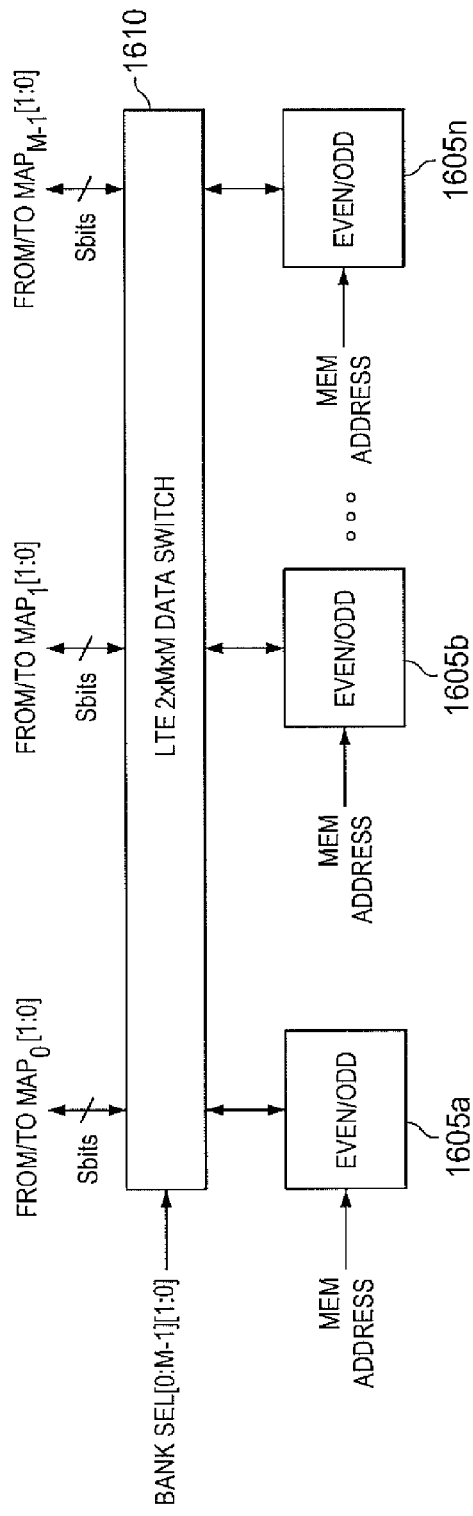
FIG. 16 illustrates an LTE parallel QPP processing switch according to embodiments of the present disclosure.

FIG. 16 illustrates an LTE parallel QPP processing switch according to embodiments of the present disclosure. The embodiment of the QPP processing switch 1600 shown in FIG. 16 is for illustration only. Other embodiments could be used without departing from the scope of this disclosure.

Multiple memory blocks 1605a-1605n can be coupled to one or more MAP decoders, such as MAP decoders 310-325, through LTE 2×M×M data switch 1610. Each MAP can support two simultaneous read (RD) accesses and write (Wr) accesses to a memory block 1605a-1605n per cycle. The memory blocks 1605a-1605n are 4/8 memory blocks total that can be divided into two sets (even/odd) of 4/8 memory blocks. Based on Equation 2 above, in case of four MAPs, the start address of the next output for each MAP is (P_init(k)+f1+f2+2*f2*(k*n/4)) mod n where k is the MAP number (k=(0.3)) and n is the block size. Since f2 is always even, the term 2*f2*(k*n/4) mod n=0. Therefore, the G_init, g(k*n/4) is equal to (f1+f2)mod n. However, in the case of 8 MAPs, the next output is P_init(k)+f1+f2+2*f2*(k*n/8) where k=(0.7). In the 8 MAP case, it is not always guaranteed that the G_init, g(k*n/8) is (f1+f2)mod n. While in k=even case, G_init is (f1+f2)mod n, in k=odd case the G_init, g(k*n/8) is equal to (f1+f2+f2*n/4)mod n. This term is equal to (f1+f2+f2/4*n) mod n, or, in other way (f1+f2+f2/2*n/2). f2 is an even number, in cases where f2/2 is even (f2 mod 4=0), G_init is (f1+f2)mod n, and when f2/2 is odd (f2 mod 4=2), G_init is equal to (f1+f2+n/2)mod n. The same approach can be applied to 16 MAP and higher to support higher bit rate (1 Gbps) LTE/ADV.

When multi-segment per MAP used, the temporal values of P_out and G_out are saved in the end of the alpha session (assuming alpha session is extended also on the learning period for beta) to be reserved later for P_init and G_init of the beta session. This saves an extra complex calculation of QPP interleaver for address gap between the end of the alpha session to the init of the beta learning session.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a receiver configured to decode encoded transmissions, the receiver comprising:
a number of receive antennas configured to receive data;
a plurality of memory units configured to store the received data;
a turbo decoder configured to divide the received data into a plurality of sub blocks, the turbo decoder comprising a plurality of decoders configured to perform a Turbo decoding operation, each of the plurality of decoders further configured to decode each sub block concurrently and in sync with one another for processing alpha, beta and lambda values; and
a data switch fabric configured to selectively couple one or more of the plurality of decoders to one or more of the plurality of memory units,
wherein at least one sub block is extended to tail bits, a first portion of the tail bits used to write the lambda value and a second portion of tail bits used to learn the beta value.

2. The receiver as set forth in claim 1, wherein at least two of the plurality of decoders are configured to perform the Turbo decoding operation using a parallel process.

3. The receiver as set forth in claim 1, wherein the turbo decoder is configured to perform a Wideband Code Division Multiple Access (WCDMA) operation comprising a switching operation configured to enable each decoder of the plurality of decoders to access a respective memory unit of the plurality of memory units.

4. The receiver as set forth in claim 1, wherein the turbo decoder is configured to perform a long term evolution (LTE) operation comprising a switching operation configured to perform at least one of:
enable each decoder of the plurality of decoders to access at least two of the plurality of memory units in cross memory processing; and
enable each decoder of the plurality of decoders to access a respective memory unit of the plurality of memory units in independent processing.

5. The receiver as set forth in claim 4, wherein the receiver is configured to select between the cross memory processing and the independent processing based on a data block size of the data.

6. The receiver as set forth in claim 1, wherein at least one decoder of the plurality of decoders is configured to compute a beta value based on a tail bit for a learning period and wherein at least one decoder of the plurality of decoders is configured to compute the alpha value based on a previous decode operation for a learning period.

7. The receiver as set forth in claim 1, wherein each of the plurality of decoders is configured to perform a simultaneous read and write operation from at least one of the plurality of memory units.

8. The receiver as set forth in claim 1, further comprising a quadratic permutation polynomial (QPP) interleaver configured to generate a dual binary output.

9. For use in a wireless communications device, a decoder configured to decode encoded transmissions, the decoder comprising:
a plurality of memory units configured to store data; and
a turbo decoder configured to divide the data into a plurality of sub blocks, the turbo decoder comprising a plurality of unit decoders, each of said plurality of unit decoders comprising:
a processor array;
a controller configured to execute a plurality of instructions, and cause each of said plurality of unit decoders to:
perform a Turbo decoding operation; and
decode each sub block concurrently and in sync with one another; and
a data switch fabric configured to selectively couple one or more of the plurality of decoders to one or more of the plurality of memory units, wherein at least one sub block is extended to tail bits, a first portion of the tail bits used to write a lambda value and a second portion of tail bits used to learn a beta value.

10. The decoder as set forth in claim 9, wherein at least two of the plurality of unit decoders are configured to perform the Turbo decoding operation using a parallel process.

11. The decoder as set forth in claim 9, wherein the turbo decoder is configured to perform a Wideband Code Division Multiple Access (WCDMA) operation comprising a switching operation configured to enable each unit decoder of the plurality of unit decoders to access a respective memory unit of the plurality of memory units.

12. The decoder as set forth in claim 9, wherein the turbo decoder is configured to perform a long term evolution (LTE) operation comprising a switching operation configured to perform at least one of:
   enable each unit decoder of the plurality of unit decoders to access at least two of the plurality of memory units in cross memory processing; and
   enable each unit decoder of the plurality of unit decoders to access a respective memory unit of the plurality of memory units in independent processing.

13. The decoder as set forth in claim 12, wherein the receiver is configured to select between the cross memory processing and the independent processing based on a data block size of the data.

14. The decoder as set forth in claim 9, wherein each of the plurality of decoders is configured to perform a simultaneous read and write operation from at least one of the plurality of memory units.

15. The decoder as set forth in claim 9, further comprising a quadratic permutation polynomial (QPP) interleaves configured to generate a dual binary output.

16. A method for decoding transmissions in a wireless communications network, the method comprising:
   receiving a data transmission;
   storing the data in a plurality of memory units;
   dividing the data into a plurality of sub blocks; and
   performing parallel Turbo decoding operations by a plurality of decoders concurrently and in sync with one another, wherein each of the plurality of decoders is configured to decode each sub block using a data switch fabric that selectively couples one or more of the plurality of decoders to one or more of the plurality of memory units,
   wherein at least one sub block is extended to tail bits, a first portion of the tail bits used to write a lambda value and a second portion of tail bits used to learn a beta value.

17. The method as set forth in claim 16, wherein the plurality of decoders is configured to perform a long term evolution (LTE) operation comprising one of an independent operation and a cross memory operation.

18. The method as set forth in claim 17, further comprising selecting one of the independent operation and the cross memory operation based on a data block size of the data.

19. The method as set forth in claim 16, wherein performing parallel Turbo decoding operations comprises performing a simultaneous read and write operation from at least one of the plurality of memory units.

20. The method as set forth in claim 16, generating a dual binary output using a quadratic permutation polynomial (QPP) interleaver.

* * * * *